US005981866A

United States Patent [19]

Edelson

[11] Patent Number: 5,981,866

[45] Date of Patent: Nov. 9, 1999

[54] PROCESS FOR STAMPABLE PHOTOELECTRIC GENERATOR

[75] Inventor: Jonathan Sidney Edelson, Multnomah County, Oreg.

[73] Assignee: Borealis Technical Limited, London, United Kingdom

[21] Appl. No.: 09/016,089

[22] Filed: Jan. 30, 1998

[51] Int. Cl.[6] .................................................... H01L 31/00

[52] U.S. Cl. ........................... 136/256; 438/597; 438/669

[58] Field of Search ............................. 136/256; 438/597, 438/669

[56] References Cited

U.S. PATENT DOCUMENTS

| | | | |
|---|---|---|---|
| 5,019,176 | 5/1991 | Brandhorst, Jr. et al. | 136/256 |
| 5,468,324 | 11/1995 | Hong . | |
| 5,477,088 | 12/1995 | Rockett et al. | 136/256 |
| 5,494,782 | 2/1996 | Maenza et al. . | |
| 5,635,114 | 6/1997 | Hong . | |

*Primary Examiner*—Mark Chapman

[57] ABSTRACT

Manufacture of a photoelectric converter by a photolithographic or stamping process prior to coating with a photoelectrically emissive material is described. This gives an economic and simple means of mass-producing photoelectric converter cells, and in one aspect is analogous to that used for pressing optical discs.

20 Claims, 7 Drawing Sheets

PROCESS FOR STAMPABLE PHOTOELECTRIC GENERATOR

BACKGROUND—FIELD OF INVENTION

This invention relates to the generation of electricity using photoemission and photoemission-thermionic hybrid generators.

BACKGROUND—PHOTOELECTRIC CONVERSION

In my previous application, entitled "Method and Apparatus for Photoelectric Generation of Electricity", filed May 12, 1997, Application Ser. No. 08/854,302, and incorporated herein by reference in its entirety, I disclose a Photoelectric Generator having close spaced electrodes separated by a vacuum. Photons impinging on the emitter cause electrons to be emitted as a consequence of the photoelectric effect. These electrons move to the collector as a result of excess energy from the photon: part of the photon energy is used escaping from the electrode and the remainder is conserved as kinetic energy moving the electron. This means that the lower the work function of the emitter, the lower the energy required by the photons to cause electron emission. A greater proportion of photons will therefore cause photo-emission and the electron current will be higher. The collector work function governs how much of this energy is dissipated as heat: up to a point, the lower the collector work function, the more efficient the device. However there is a minimum value for the collector work function: thermionic emission from the collector will become a problem at elevated temperatures if the collector work function is too low.

Collected electrons return via an external circuit to the cathode, thereby powering a load. One or both of the electrodes are formed as a thin film on a transparent material, which permits light to enter the device. A solar concentrator is not required, and the device operates efficiently at ambient temperature.

My previous invention further discloses a Photoelectric Generator which is constructed using micro-machining techniques. This allows the economic mass-production of Photoelectric Generators.

BACKGROUND—OPTICAL DISCS

In a typical process for producing optical discs, molten, moisture-free, optical grade polycarbonate is injection molded into a high pressure molding machine or press using a stamper. The mold has two parts: one half is the stamper and the other half contains a mirror block to ensure a smooth surface on the CD. Pressed discs, after cooling, are transferred by robot arms to a spindle for the next stage in the process, which is metalization of the active surface of each disc with aluminum by sputtering. The aluminum layer is then protected by a lacquer which is spread as a liquid evenly across the surface of the disc by spin coating. The centrifugal force created by spinning the disc ensures that the lacquer covers the whole disc in an even layer. It is important that the lacquer overlaps the aluminum therefore sealing it from the elements. If left exposed, aluminum will start to oxidize within a few days. The lacquer is then cured by ultra-violet (UV) light. The discs are then ready for label printing using UV cured ink by a flat silk screen process.

Of particular relevance to the present invention is the scale of the structures reliably produced by the above injection molding process. Optical discs with a track pitch of 0.8 microns and a pit depth of 0.15 microns are commonly mass produced, with smaller scale structures being produced.

The stamper used in the mold is typically fabricated by exposing a glass substrate coated with a photo-resistive layer to a laser beam. Development of the photo-resist gives a series of pits and lands which are coated with silver or nickel and electroplated to form a master, which is peeled off the glass substrate. This master is then used to form stampers for use in injection molding of the optical disc. In U.S. Pat. No. 5,494,782, incorporated herein by reference in its entirety, Maenza et al. disclose an improved process having many fewer steps which makes use of an excimer or alexandrite laser to remove material from a conducting metal substrate to form the stamper.

An alternative to the injection molding approach for optical disc manufacture is disclosed by Hong in U.S. Pat. Nos. 5,468324 and 5,635,114. According to this method, a polymer solution is deposited on a master disk, the master is then made to spin and the polymer film dries to form a film having the required thickness, which is then peeled off the master.

Another approach, which is being developed by Sage Technology, Inc., is the NeuROM process, which is the transfer of a CD or similar pattern of features to a continuous web film of metalized polyester using sub-micron scale contact photolithography and the subsequent treatment of that film into a playable machine-read read-only memory storage device. The process consists of several steps including exposure, development, etch and liftoff. The exposed and developed NeuROM film is then bonded to a 1.0 mm film of normal non-birefringent polystyrene, and the completed discs are separated from the laminate film structure using a water knife. This process does not produce the pits and lands of conventional CD manufacture, instead it produces amplitude objects which cause reflection extinction due to absorption, dispersion and diffraction. This means that the interrogating laser beam is not reflected at positions where the metalized film has been etched.

The use of any of the above methods for the fabrication of photoelectric cells or generators is unknown.

BACKGROUND—LASER MICROMACHINING

Excimer laser micro-machining, which uses lasers which produce relatively wide beams of ultraviolet laser light, is well-known. One interesting application of these lasers is their use in micro-machining organic materials (plastics, polymers, etc.). The absorption of a UV laser pulse of high energy causes ablation, which removes material without melting or distorting the material adjacent to the area machined. The shape of the structures produced is controlled by using a chrome on quartz mask, and the amount of material removed is dependent on the material itself, the length of the pulse, and the intensity of the laser light. Quite deep cuts (hundreds of microns) can be made using the excimer laser. Structures with vertical or tapered sides can be created. Higher powered lasers may be used to ablate metal surfaces.

A further approach is LIGA (Lithographie, Galvanoformung, Abformung). LIGA uses lithography, electroplating, and molding processes to produce microstructures. It is capable of creating very finely defined microstructures of up to 1000 $\mu$m high. The process uses X-ray lithography to produce patterns in very thick layers of photoresist and the pattern formed is electroplated with metal. The metal structures produced can be the final product, however it is common to produce a metal mold. This mold can then be filled with a suitable material, such as a plastic, to produce the finished product in that material.

The X-rays are produced from a synchrotron source, which makes LIGA expensive. Alternatives include high voltage electron beam lithography which can be used to produce structures of the order of 100 $\mu$m high, and excimer lasers capable of producing structures of up to several hundred microns high.

BRIEF DESCRIPTION OF THE INVENTION

The present invention discloses cheap and simple processes to manufacture a Photoelectric Generator which will find great utility, particularly in non-concentrator operation. Specifically, disclosed herein are methods for producing, in inexpensive materials using rapid mass production techniques, devices and structures which are substantially similar to those described in my previous disclosure.

Broadly, the invention discloses the fabrication of a radiant energy to electrical power transducer from a transparent first substrate by forming on one face a plurality of channels. The channels are then coated with a photoemissive material having a work function consistent with the copious emission of electrons at the wavelengths of the radiant energy source used. The first substrate is joined to a second substrate coated with a collector material to which the emitted electrons may travel.

In one embodiment the channels are formed using a stamper in a high pressure injection molding process.

In another embodiment the channels are formed using a photolithographic printing process.

In yet a third embodiment of the present invention, the channels are formed using a stamper against laminar sheets of a transparent deformable material.

In the latter two embodiments, individual cells may be formed, or preferably multiple cells may be formed on a continuous roll film, producing an array of cells on a flexible substrate, which may be cut to length and placed upon support material.

The invention further discloses a process for producing the stampers used in the various stamper molding processes described above.

OBJECTS AND ADVANTAGES

An object of the present invention is to provide a process for the manufacture of a radiant energy to electrical power transducer using a high pressure injection molding technique.

An advantage of the present invention is that the radiant energy to electrical power transducer may be manufactured on a modified optical disk assembly.

An advantage of the present invention is that inexpensive plastic materials may be used to form the substrates of a radiant energy to electric power transducer, rather than silicon or quartz.

An advantage of the present invention is that it allows reliable, economic and efficient production of a radiant energy to electrical power transducer.

An object of the present invention is to provide a process for the manufacture of a radiant energy to electrical power transducer using a photolithographic printing technique.

An advantage of the present invention is that a number of radiant energy to electrical power transducers may fabricated into an array on a flexible roll.

An advantage of the present invention is that radiant energy to electrical power transducers may be produced quickly, efficiently and at a high throughput, leading to economic photoelectric generators comprised of arrays of radiant energy to electrical power transducers.

Reference Numerals in the Drawings

103. Flexible transparent substrate
104. Film of biaxially-orientated polystyrene
106. Photoresist
108. Photolithographic Mask
112. Depression
122. Conductive material
124. Vapor Deposition Mask
126. Vapor Deposition path
132. Photoemissive material
142. Light
144. Electrical connector
146. Electrical load
148. Saw-tooth shaped depression
152. Connector strip
154. Circular depression
156. Joining line
202. Substrate
212. Stamper
214. Ablating laser
222. Stamped substrate
224. Vacuum deposition source
226. Substrate
230. Inter-electrode space

DESCRIPTION OF THE DRAWINGS

FIG. 1(*a*) is a schematic representation of a photolithographic exposure step.

FIG. 1(*b*) is a schematic representation of a substrate modified by photolithographic exposure and subsequent development.

FIG. 1(*c*) is a schematic representation of a vacuum deposition step to form a conductive layer.

FIG. 1(*d*) is a schematic representation of a vacuum deposition step to form a photoemissive layer.

FIG. 1(*e*) is a schematic representation of a finished photoelectric generator.

FIG. 1(*f*) is a schematic representation of a substrate having saw tooth shaped depressions cut into it.

FIG. 1(*g*) is a schematic representation of a vacuum deposition step to create a conductive layer.

FIG. 1(*h*) is a schematic representation of a vacuum deposition step to create a photoemissive layer.

FIG. 1(*i*) is a schematic representation of a finished photoelectric generator.

FIG. 1(*j*) is a schematic representation of arrays of photoelectric emitters and collectors.

FIG. 1(*k*) is a schematic representation of an array of photoelectric cells showing connections between the cells, formed from the arrays of emitters and collectors.

FIG. 1(*l*) is an exploded view of a finished photoelectric generator, showing electrical connections between the cells FIG. 2(*a*) is a conductive metal substrate.

FIG. 2(*b*) is a schematic representation of a metal substrate modified by laser ablation.

FIG. 2(*c*) is a schematic representation of a stamped substrate being coated with a photoemissive layer by vacuum deposition.

FIG. 2(*d*) is a schematic representation of a collector and an emitter.

FIG. 2(*e*) is a plan view of an emitter and collector structure before they are joined together, showing the electrical connections.

FIG. 2(*f*) is a schematic showing a finished photoelectric generator.

DETAILED DESCRIPTION OF THE INVENTION

The following description describes preferred embodiments of the invention and should not be taken as limiting the invention.

Figure 1A:
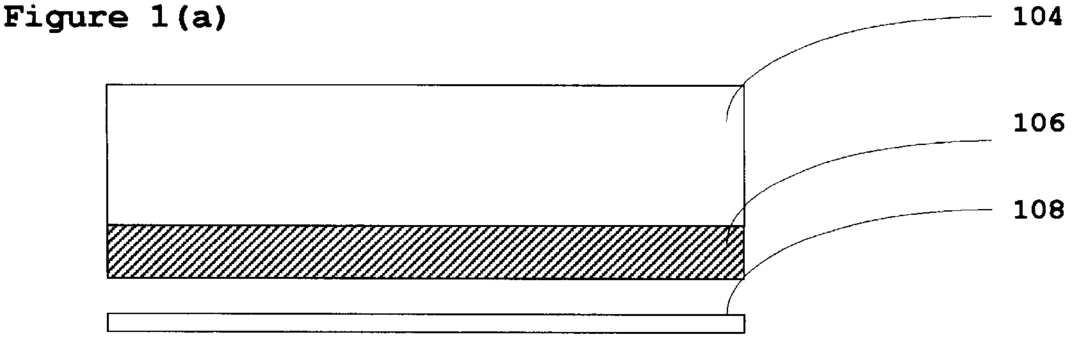
FIGS. 1 and 2 are schematic representations of processes for making photoelectric converters.
Figure 1B:
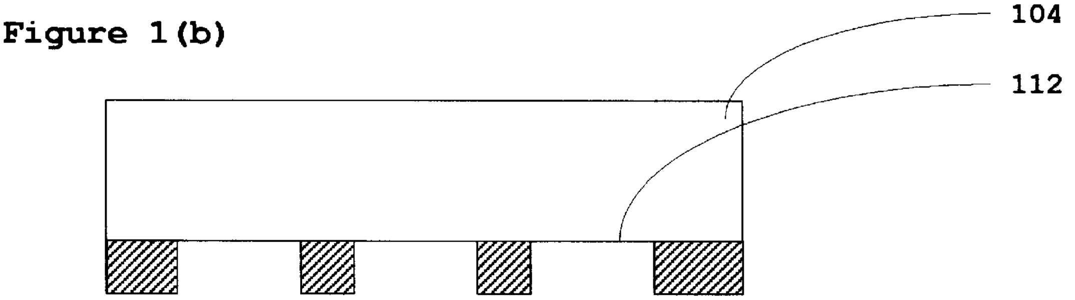
Figure 1C:
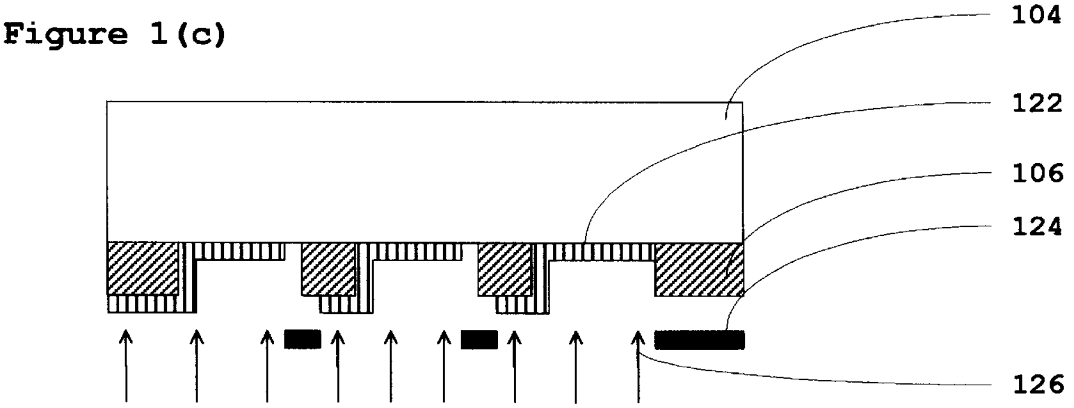
Figure 1D:
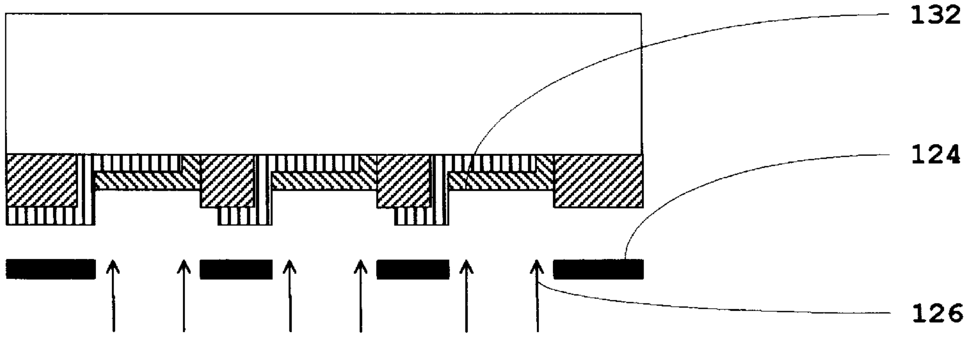
Figure 1E:
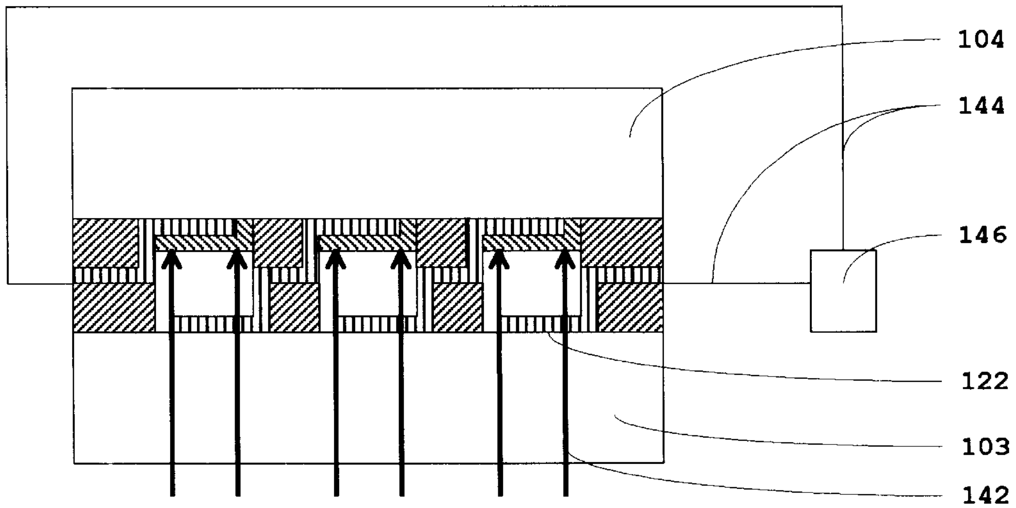
Figure 1F:
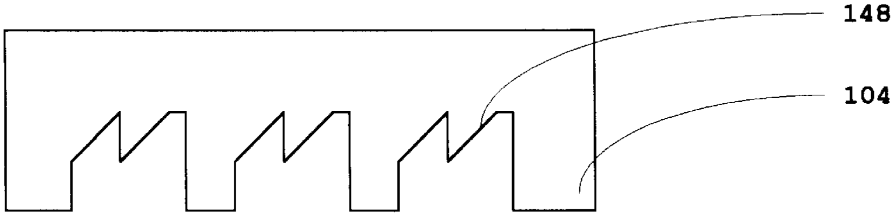
Figure 1G:
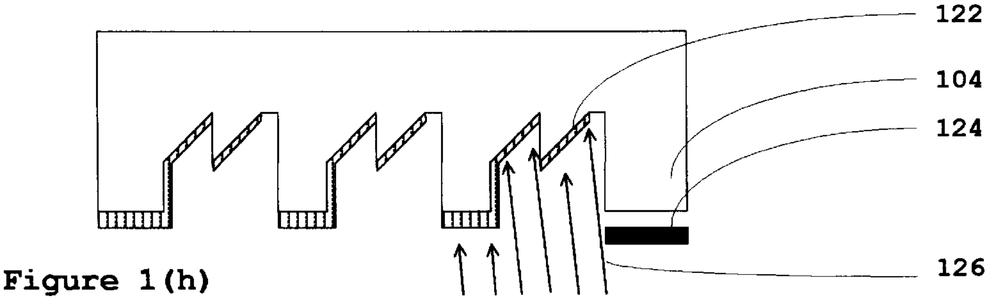
Figure 1H:
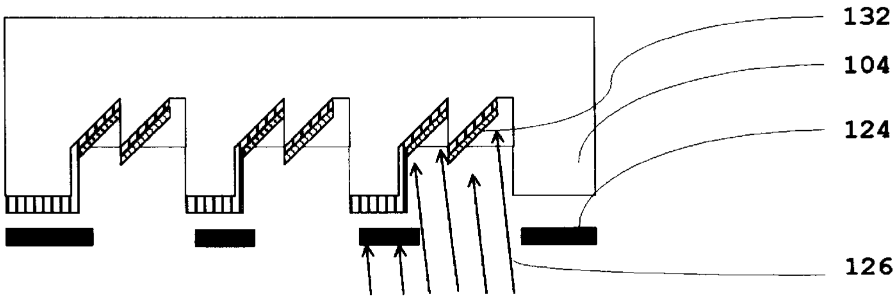
Figure 1I:
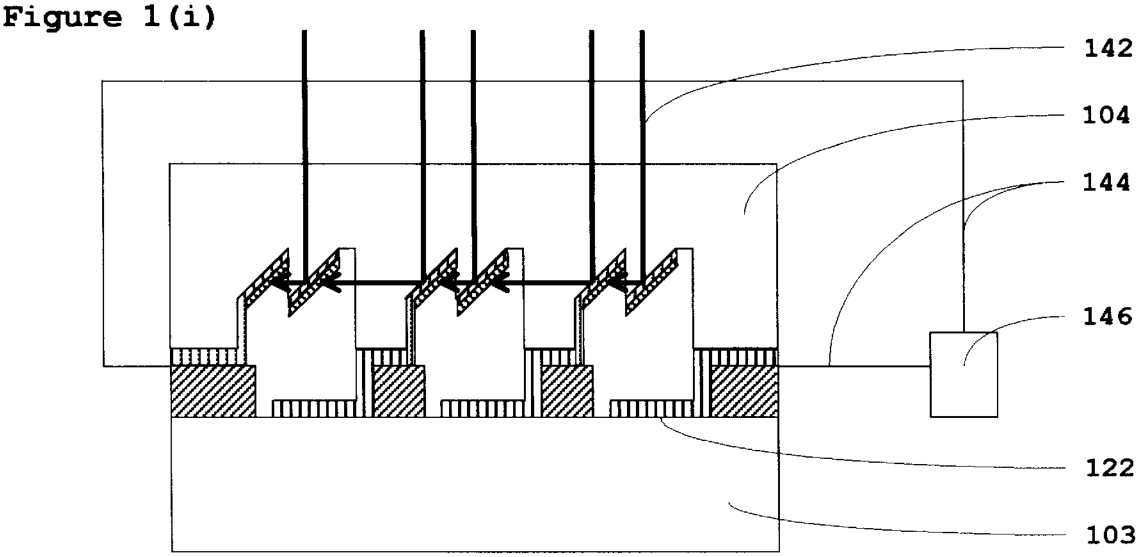
Figure 1J:
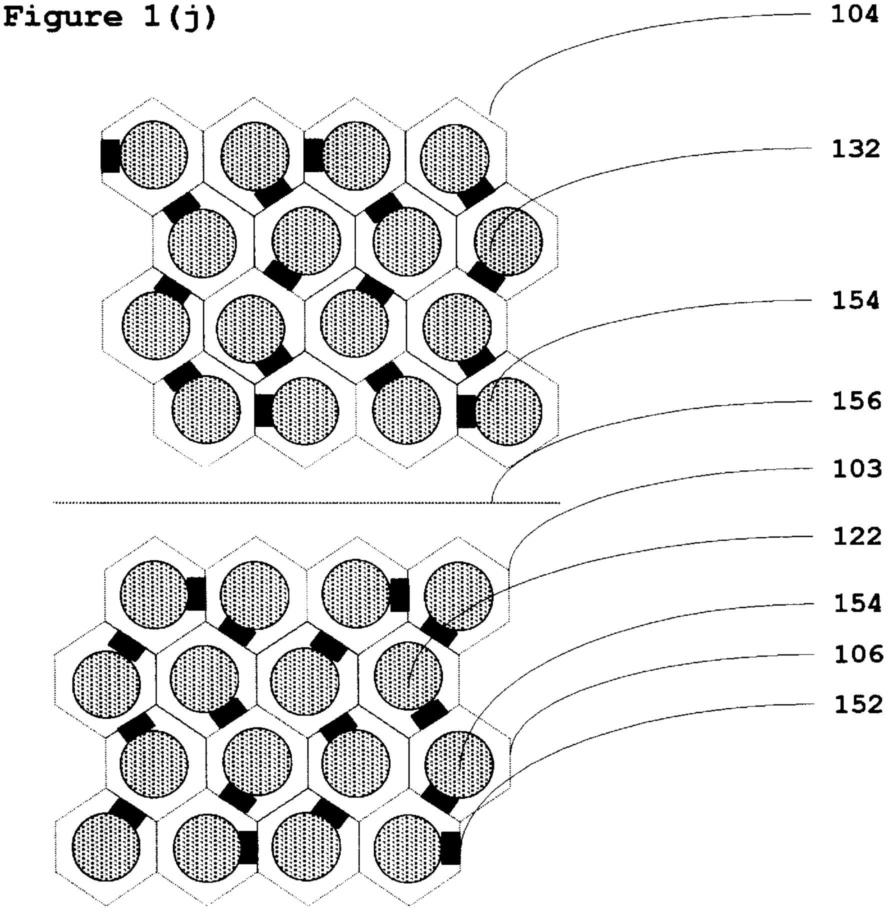
Figure 1K:
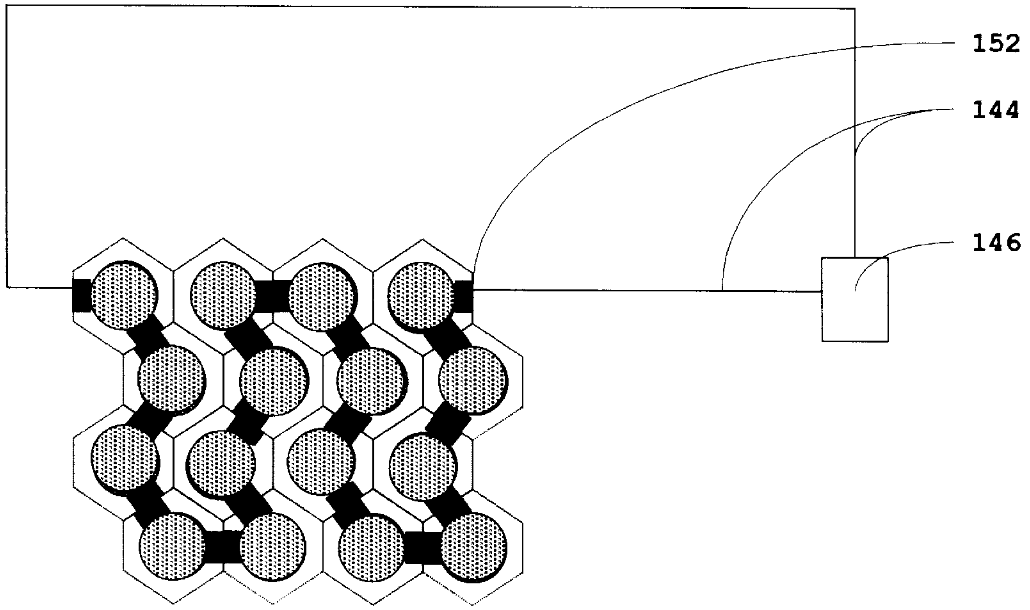
Figure 1L:
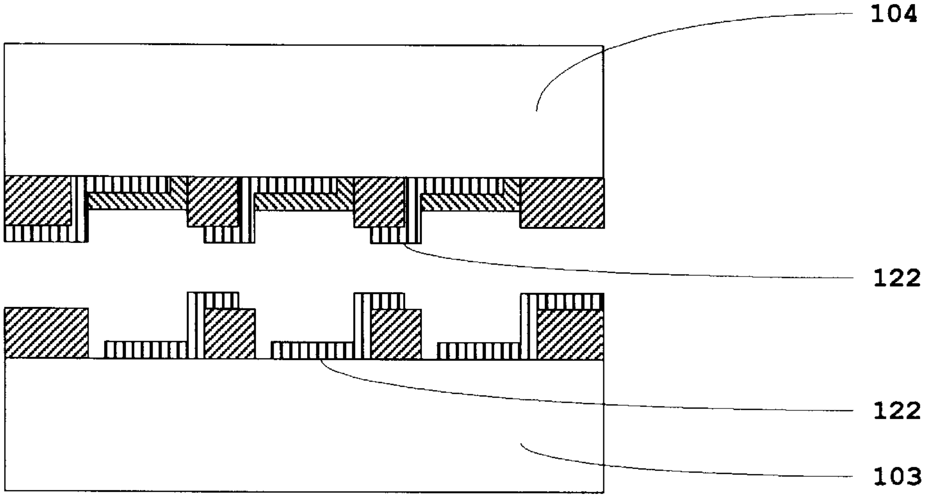

Referring now to FIG. 1(*a*), a transparent flexible film of biaxially-orientated polystyrene 104 coated with a photoresist layer 106, is exposed to light through a mask 108. Photoresist layer 106 is developed to leave a predetermined pattern of depressions 112 in the surface of film 104, as shown in FIG. 1(*b*). In FIG. 1(*c*), a conductive layer 122 is coated onto film 104 by vacuum deposition 126 of a material, such as nickel or silver, using a mask 124 to ensure that the layer of conductive material 122 is deposited on the floor of depression, on one of the adjacent sides, and on the surface of photoresist layer 106. In FIG. 1(*d*) photo-emissive material 132 is coated onto the layer of conductive material 122 by vacuum deposition 126 using mask 124 to ensure that photoemissive material 132 is deposited only on the floor of the depressions. Photoemissive material 132 has a work function of 1.8 eV or less, and is, for example, bariated or thoriated tungsten. This value is chosen because it permits electrons to be emitted by the visible wavelengths present in sunlight at the surface of the earth. This produces the emitter structure. A second transparent flexible substrate 103 is treated in similar fashion to that shown in FIGS. 1(*a*)–1(*d*), to produce the collector structure. The collector structure is essentially the same as the emitter structure, with the exception that the photoemissive layer is not used, and with the variation that the layer of conductive material 122 on the collector substrate 103 is sufficiently thin to allow light 142 to pass through, as shown in FIG. 1(*e*). Conductive material 122 may be coated with a transparent low work function material to facilitate the efficient collection of electrons.

The two substrates 103 and 104 are now arranged facing each other and are joined together, for example, by heat bonding or gluing. The arrangement of conductive material 122 on both substrates is such that the various photoelectric cells formed are arranged to be electrically in series. This is shown in exploded form in FIG. 1(*l*).

Electrical connectors 144 connect conductive material 122 to load 146. This arrangement of electrical connectors ensures that the individual photocells of the array of elements are optically in parallel but electrically in series, as shown in FIG. 1(*e*).

In a particularly preferred embodiment, the emitter and collector substrates 103 and 104 are joined in an atmosphere of an inert gas, such as dry argon, at a pressure which is above atmospheric pressure. This positive pressure prevents the collector and emitter surfaces from touching. This requires that the substrates used are gas impermeable. If this is not the case, they are cemented between two glass plates.

Referring now to FIG. 1(*f*), which shows another preferred embodiment, a series of grooves 148 having a saw-tooth cross-section are introduced into a transparent flexible film of biaxially-orientated polystyrene 104. The grooves are introduced using a ruling engine, an engraver or by laser ablation to remove material. In FIG. 1(*g*), a conductive layer 122 is coated onto film 104 by vacuum deposition 126 of a material such as nickel or silver, using a mask 124. The vacuum deposition source is positioned to one side of film 104 to ensure that the layer of conductive material 122 is deposited on the angled face of the saw tooth depression, on one of the adjacent sides, and on the surface of the film 104. In FIG. 1(*h*) photo-emissive material 132 is coated onto the layer of conductive material 122 by vacuum deposition 136 using mask 134. The vacuum deposition source is positioned to one side of film 104 to ensure that the layer of photo-emissive material 132 is deposited only the angled face of the saw tooth depression. Photoemissive material 132 has a work function of 1.8 eV or less, and is, for example, bariated or thoriated tungsten. This value is chosen because it permits electrons to be emitted by the visible wavelengths present in sunlight at the surface of the earth. A second substrate 103 is treated in similar fashion to that shown in FIGS. 1(*a*)–1(*d*) to produce the collector structure. The depressions of the collector structure are flat, and may be coated with work function lowering materials. The collector structure of the present embodiment is not transparent.

The two substrates 103 and 104 are now arranged facing each other and are joined together, for example, by heat sealing or through the use of an adhesive, as shown in FIG. 1(*i*). Electrical connectors 144 connect conductive material 122 to load 146. This arrangement of electrical connectors ensures that the individual photocells of the array of elements are optically in parallel but electrically in series, as shown in FIG. 1(*i*). Light 142 enters through the transparent film 104 and impinges on the reflective backside of the saw tooth depression and onto the surface of the adjacent emitter material, as shown in FIG. 1(*i*). Electrons are emitted by the photoelectric effect, traveling through the interelectrode space to the collector electrodes.

In a particularly preferred embodiment, the emitter and collector substrates 103 and 104 are joined in an atmosphere of an inert gas, such as dry argon, at a pressure which is above the surrounding atmospheric pressure. This positive pressure prevents the collector and emitter surfaces from touching. This requires that the substrates used are gas impermeable. If this is not the case, they may be cemented between two glass plates.

FIGS. 1(*e*) and 1(*i*) disclose linear arrays of photoconverter cells, schematically diagrammed in cross section. The schematic representation exaggerates the area used for collector to emitter contact surfaces, with respect to the area used for emissive and collective electrodes. The schematic representation also does not reveal edge conductive areas or electrical 'mains' where photoelectric activity may be sacrificed in order to provide improved electrical conductivity. Such electrical distribution techniques are well known, and will be obvious to an individual skilled in solar cell design. In a most preferred embodiment, the processes disclosed above are applied to the manufacture of a sheet of photoconverter cells as shown in FIG. 1(*j*). This shows a plan view of two modified substrates. Substrate 103 is modified according to the steps shown in FIGS. 1(*a*) to 1(*c*): a series of circular depressions 154 in photoresist layer 106 are produced and coated with electrically conductive material 122 by vacuum deposition using mask 124. The mask is designed so that a tab 152 of the conductive material 122 is deposited on the surface of the photoresist as shown in FIG. 1(*j*). Film 104 is modified in a similar manner and then a layer of photoemissive material 132 is deposited on the surface of circular depressions 154. The pattern of hexagonally shaped photoelectric cells, each having an edge connector, are now joined together through the use of an adhesive or by suitable heat sealing techniques. This may be visualized by hinging the two structures shown in FIG. 1(*j*)

together along dotted line 156. Tabs 152 on one substrate, providing electrical connectivity to the emitter materials, contact to corresponding tabs on the other substrate, providing electrical connectivity to the collector materials of an adjoining cell, and form an array of photoelectric cells which are electrically in series and optically in parallel as shown in FIG. 1(*k*). Electrical connectors 144 connect conductive tabs 152 to load 146.

Figure 2A:
Figure 2B:
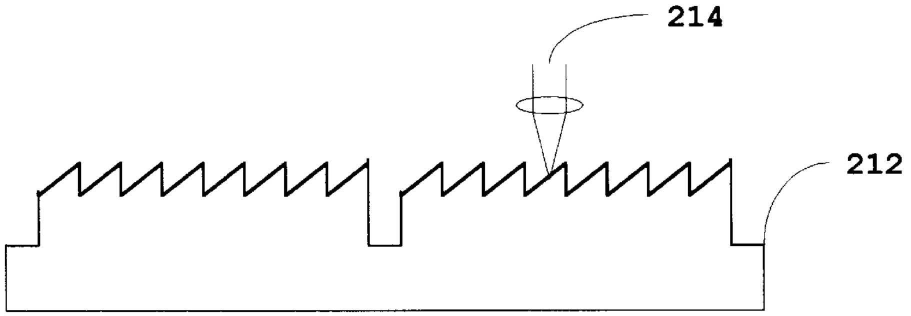
Figure 2C:
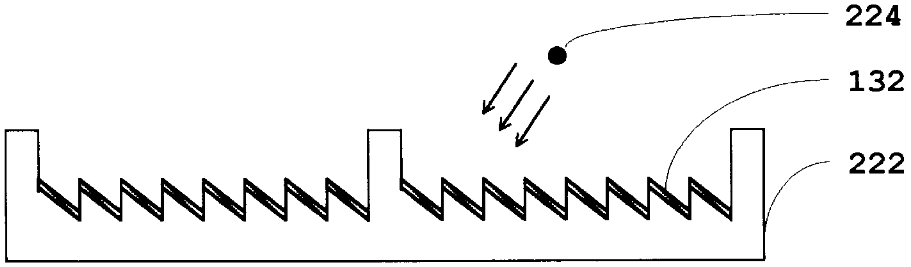
Figure 2D:
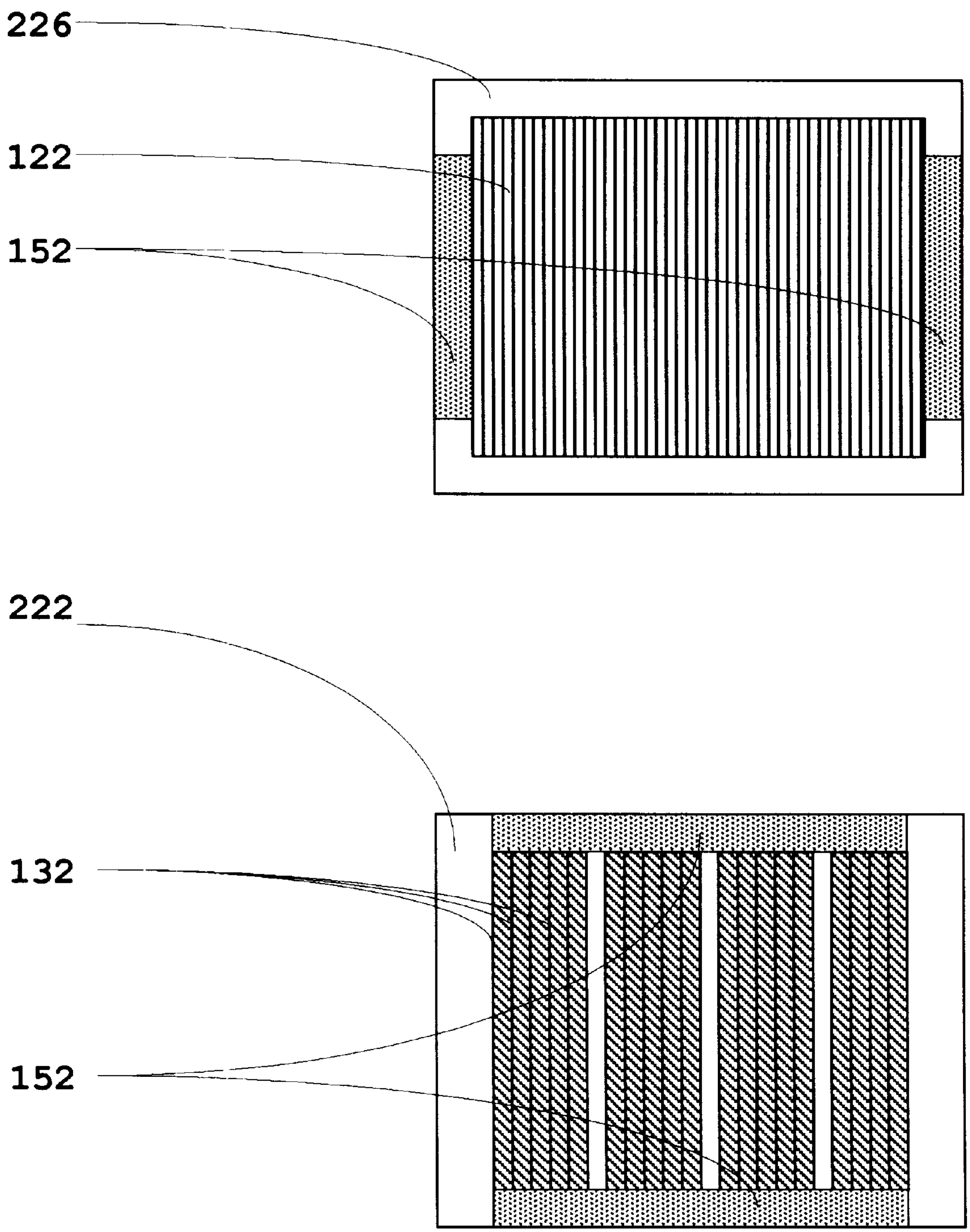
Figure 2E:
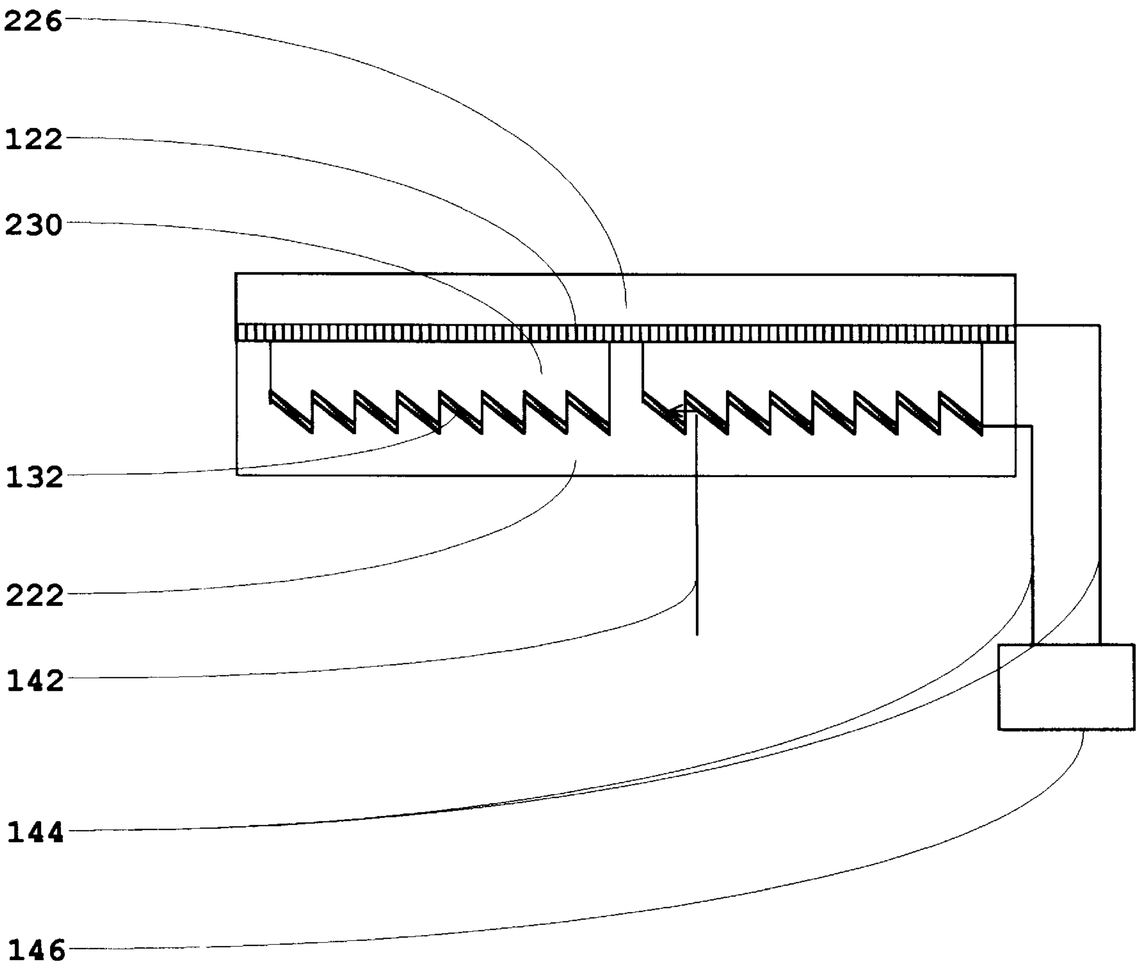

Another preferred process for manufacturing a photoelectric generator is shown in FIG. 2 in which utilizes excimer laser ablation of a conductive nickel substrate 202 to form a saw-tooth shaped stamper 212 directly as shown in FIG. 2(*b*). The stamper 212 is used to form a transparent emitter substrate 222 for the photoelectric converter shown in FIG. 2(*c*) by injection molding of polycarbonate resin at high pressure into a mold comprising the stamper and allowing it to solidify.

Referring again to FIG. 2(*c*), the emitter electrode substrate 222 is masked to protect the lands. The substrate is placed in a vacuum deposition chamber at an angle, such that material from source 224 is deposited on one side of the saw tooth only, to form an emitter 132. The emitter is a thin film of a photoelectric emitter material having a work function of 1.8 eV or less, for example, bariated or thoriated tungsten. This value is chosen because it permits electrons to be emitted by the visible wavelengths present in sunlight at the surface of the earth.

Referring now to FIG. 2(*d*), another substrate 226 is coated with a thin layer of electrically conducting material to form a collector 122. A conductive connector strip 152 is formed along two edges of the collector substrate 226, and a second conductive connector strip 152 is formed along two edges of the emitter substrate 222. Thus when the two are joined together, electrical contact between the emitter 132 and collector 122 is avoided, as shown in FIG. 2(*e*). Emitter substrate 222 and collector substrate 226 are joined by the application of heat or by an adhesive to the finished radiant energy to electrical power transducer. Electrical connectors 144 connect electrical load 146 with emitter 132 and collector 122. FIG. 2(*e*) also illustrates the functioning of the radiant energy to electrical energy transducer. Light 142 enters through the transparent substrate 222 and is reflected onto the surface of the emitter 132. Electrons are emitted as a consequence of the photoelectric effect and move to a collector 122 which is separated from the emitter 132 by a space 230. These electrons move to the collector 122 as a result of excess energy from the incident photons: part of the photon energy is used escaping from the metal and the remainder is conserved as kinetic energy moving the electron. This means that the lower the work function of the emitter, the lower the energy required by the photons to cause electron emission. A greater proportion of photons will therefore cause photo-emission and the electron current will be higher.

SUMMARY, RAMIFICATIONS AND SCOPE

The foregoing specification discloses processes for manufacturing radiant energy to electrical power transducers. These may be joined together in arrays, particularly as embodied in FIG. 1(*k*) to form a photoelectric generator.

Although the above specification contains many specificities, these should not be construed as limiting the scope of the invention but as merely providing illustrations of some of the presently preferred embodiments of this invention.

The above specification describes transparent films and substrates made of biaxially-orientated polystyrene or polycarbonate other transparent polymers such as polyester, polyethylene, polystyrene or polypropylene, and copolymers may be also be used. Conducting polymers may also be utilized. Injection molding using non-polymeric materials is also possible. Transparent materials are described for both collector and emitter, however only one such side need be transparent, allowing the other to be formed from opaque materials, or allowing the other side to be coated with opaque material. For example, in situations where gas permeability needs to be reduced, a substrate may be metalized or mounted on a bulk opaque support.

The above specification describes one method for the production of a suitable stamper. Other methods include exposing a glass substrate coated with a photo-resistive layer to a laser beam. Development of the photo-resist gives a series of pits and lands which are coated with silver or nickel and electroplated to form a master, which is peeled off the glass substrate. This master is then used to form stampers for use in injection molding.

The above specification describes the use of high pressure injection molding between a suitable stamper and a 'mirror blank'. Rather than use such a mirror blank, thereby producing a single loose substrate, a flexible sheet of material may be used in place of the mirror blank, thereby producing a collected array of electrodes.

The above specification describes high pressure injection molding for forming the substrate: other methods include depositing a polymer solution on a master spinning the master and allowing the polymer film to dry and to form a film having the required thickness, which is then peeled off the master.

In addition to the use of a stamper, photolithographic, laser ablation, ruling, embossing and engraving techniques may be utilized.

Although depressions are formed on one substrate according the specification above, a similar device may be constructed in which a depression is patterned into both surfaces.

The specification describes vapor deposition techniques for forming coatings on the substrates. Other approaches well-known in the art for forming coatings may be used, including silk screen printing, application by air-brush, solution plating, pressing, and inking In addition to the heat-sealing and adhesing methods described in the specification for joining the two substrates, other methods including chemical bonding, the use of electret techniques to establish a permanent static charge between the substrates, or magnetism, may be used.

The above specification describes the use of bariated or thoriated tungsten to form the photo-emissive layer; other materials which allow the photo-emission of electrons at the wavelengths of the incident radiation may be used, including photo-emissive electrides and alkalides, as well as diamond, diamond-related and diamond-like materials.

I claim:

1. A method for producing a radiant energy to electrical power transducer comprising the steps of:

a) forming a predetermined pattern of channels into a face of a transparent first substrate using a forming means, b) forming a layer of conductive material on the floor and sides of said channels and on part of said face using a deposition means, c) forming a layer of photoelectrically emissive material on the floor of said channels using a deposition means, d) joining said coated first substrate to a second substrate having an electrically conductive surface using a joining means, so that said coating of photoelectrically emissive material on said first substrate is separated from said electrically conductive surface on said second substrate by a sealed gap.

2. The method of claim 1 in which said forming means is selected from the group consisting of stamper means, photolithographic means, laser ablation means, ruling means, embossing means and engraving means.

3. A method of manufacturing the stamper of claim 2 comprising the steps:

a) providing a conductive substrate, b) moving a focal point of a beam of a laser over a surface of said conductive substrate in a predetermined pattern so as to allow for the formation of channels and lands, c) controlling the exposure of said beam to said conductive substrate as the focal point of said beam is being moved such that exposed portions of said conductive substrate are directly ablated thereby creating said channels, and unexposed portions of said conductive substrate are unaltered thereby creating said lands.

4. The method of claim 1 in which said second substrate having an electrically conductive surface is selected from the group consisting of metal foil, a metalized film, a conductive polymer and a substrate coated with a layer of conductive material.

5. The method of claim 1 in which said deposition means is selected from the group consisting of vapor deposition means, silk screening, airbrushing, solution plating, pressing, and inking.

6. The method of claim 1 in which said joining means is selected from the group consisting of heat bonding, adhesing, joining through a chemical reaction, joining by mechanical means, and joining through electrostatic charge.

7. The method of claim 1 in which said channels have a saw-tooth shaped cross section whereby one wall is inclined at 90° to said face and the other wall inclined at 45° to said face.

8. The method of claim 7 in which said channels inclined at 45° to said face are coated with a photoelectrically emissive material by deposition means.

9. The method of claim 8 in which said deposition means is a vapor deposition means using a source aligned at right angles to said furrows inclined at 45° to said face.

10. The method of claim 1 in which said joining of said first and second substrates is accomplished in a vacuum.

11. The method of claim 1 in which said joining of said first and second substrates is accomplished in a dry, inert atmosphere.

12. The method of claim 11 in which the pressure of said atmosphere is greater than that of the environment in which said radiant energy to electrical power transducer is to be used.

13. The method of claim 1 additionally comprising the step of introducing spacer means between said photoelectrically emissive material and said electrically conductive material.

14. The method of claim 13 in which said spacer means is selected from the group consisting of a printed ink, a printed resin, and a non-conductive insert.

15. The method of claim 1 in which said first and second substrate are impermeable to gas.

16. The method of claim 1 additionally comprising the step of joining said first and second substrates to a transparent gas-impermeable material.

17. The method of claim 16 in which said transparent gas-impermeable material is glass.

18. The method of claim 1 in which said photoelectrically emissive material is selected from the group consisting of bariated or thoriated tungsten and an electride or an alkalide.

19. The method of claim 1 in which said conductive material is selected from the group consisting of silver or nickel.

20. The method of claim 1 in which said transparent first and second substrate is selected from the group consisting of polycarbonate, polyester, polystyrene, polypropylene and polyethylene.

* * * * *